United States Patent
Miyamoto et al.

(10) Patent No.: US 6,374,397 B1
(45) Date of Patent: Apr. 16, 2002

(54) LOT DETERMINATION APPARATUS, LOT DETERMINATION METHOD, AND RECORDING MEDIUM FOR STORING THE METHOD

(75) Inventors: Yuki Miyamoto; Takeo Ishibashi, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/332,984

(22) Filed: Jun. 15, 1999

(30) Foreign Application Priority Data

Dec. 28, 1998 (JP) .......................................... 10-372983

(51) Int. Cl.⁷ .......................... G06F 17/50; G06F 19/00; G06K 9/80
(52) U.S. Cl. .......................... 716/21; 700/110; 700/120; 700/121; 382/144; 382/151
(58) Field of Search .............. 716/19–21; 700/108–110, 700/118–121; 430/30; 382/144–152, 154

(56) References Cited

U.S. PATENT DOCUMENTS

| | | | |
|---|---|---|---|
| 5,497,331 A | * 3/1996 | Iriki et al. | 700/121 |
| 5,671,165 A | * 9/1997 | Tomimatu | 702/94 |
| 5,787,190 A | * 7/1998 | Peng et al. | 382/145 |
| 6,092,031 A | * 7/2000 | Yasuda | 702/94 |
| 6,128,089 A | * 10/2000 | Ausschnitt et al. | 356/401 |
| 6,128,403 A | * 10/2000 | Ozaki | 382/145 |
| 6,137,578 A | * 10/2000 | Ausschnitt | 356/399 |
| 6,166,801 A | * 12/2000 | Dishon et al. | 355/27 |
| 6,233,494 B1 | * 5/2001 | Aoyagi | 700/121 |

FOREIGN PATENT DOCUMENTS

| | | | | |
|---|---|---|---|---|
| JP | 406216206 A | * | 8/1994 | H01L/21/60 |
| JP | 10-64964 | | 3/1998 | H01L/21/66 |

* cited by examiner

Primary Examiner—Matthew Smith
Assistant Examiner—Phallaka Kik
(74) Attorney, Agent, or Firm—McDermott, Will & Emery

(57) ABSTRACT

A lot determination apparatus and method and a recording medium having the lot determination method recorded thereon, wherein there can be realized a reduction in the number of times wafers are re-subjected to photolithography and prevention of elimination of a chip lot in a subsequent step, by determination of whether or not a chip is conforming through comprehensive determination of results of a plurality of inspections such as an overlay inspection, an etched pattern inspection, and a resist pattern inspection. A determination is made as to whether or not a lot is defective by comprehensive determination of results of a plurality of inspection processes, thereby preventing elimination of the lot as being nonconforming. As a result, specifications for inspections can be relaxed, which in turn enables a reduction in a reprocessing ratio. Further, no short circuit arises between the first and second patterns while determination equations are satisfied, and elimination of a lot in a subsequent process can be prevented. Link check may be carried out not only for each set of measurement points but also on the basis of analysis of results of all the measurement points. Determination equations may be more generalized.

6 Claims, 9 Drawing Sheets

```
200 : wafer
210, 220 : shots
11A~15A : resist pattern inspection points for shot 210
11B~15B : overlay inspection points for shot 210
11C~15C : dimension inspection points for shot 210
16A~20A : resist pattern inspection points for shot 220
16B~20B : overlay inspection points for shot 220
16C~20C : dimension inspection points for shot 220
```

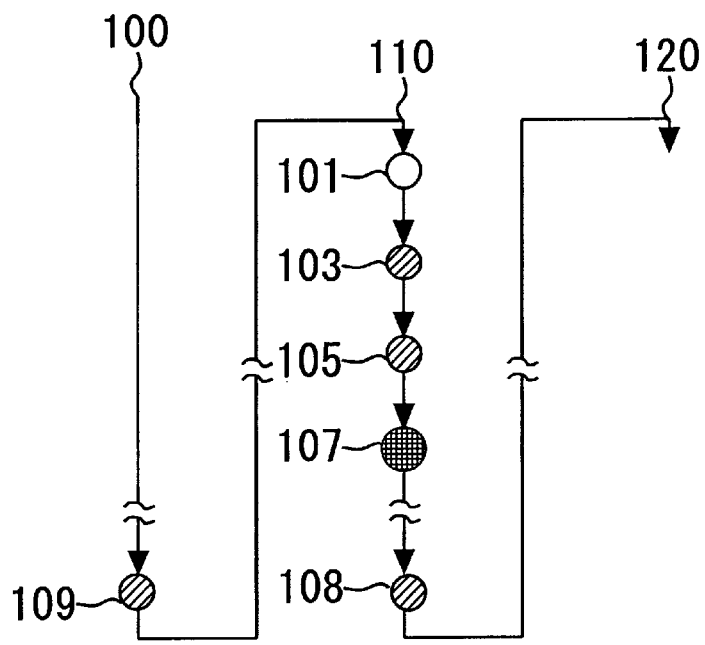
⊘ determination processes of conventional specification for major processes A and B
⬤ link specification process of the present invention for major process B
100 : major process A  103 : overlay inspection
110 : major process B  105 : resist pattern inspection
120 : major process C  107 : link determination
101 : photolithography step
108, 109 : etched pattern inspection
F I G. 1

200: wafer
210, 220: shots
11A~15A: resist pattern inspection points for shot 210
11B~15B: overlay inspection points for shot 210
11C~15C: dimension inspection points for shot 210
16A~20A: resist pattern inspection points for shot 220
16B~20B: overlay inspection points for shot 220
16C~20C: dimension inspection points for shot 220

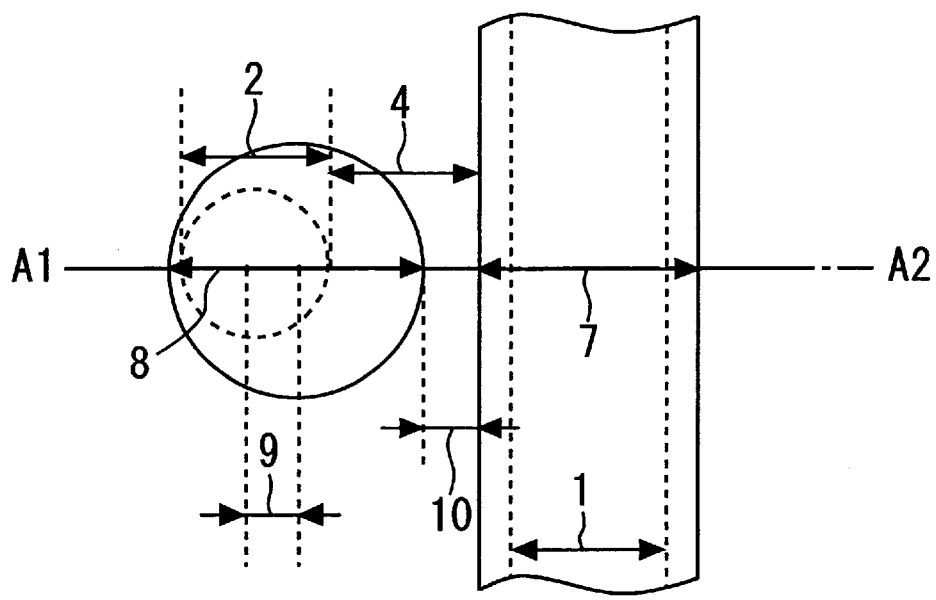
F I G. 3 A
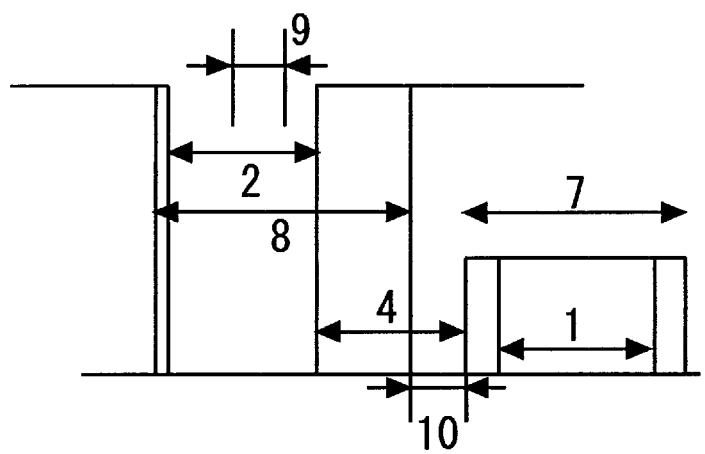
1 : etched pattern inspection target dimension
2 : resist pattern inspection target dimension
4 : design manual value
7 : etched pattern inspection dimension
8 : resist pattern inspection dimension
9 : overlay offset
10 : adjustment value
F I G. 3 B

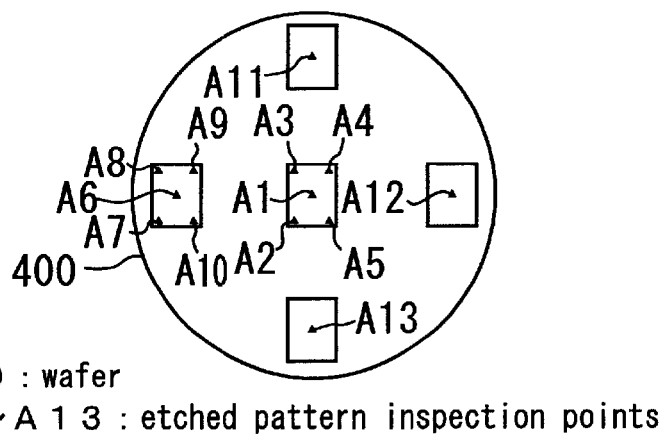
400 : wafer
A1～A13 : etched pattern inspection points
F I G. 4 A
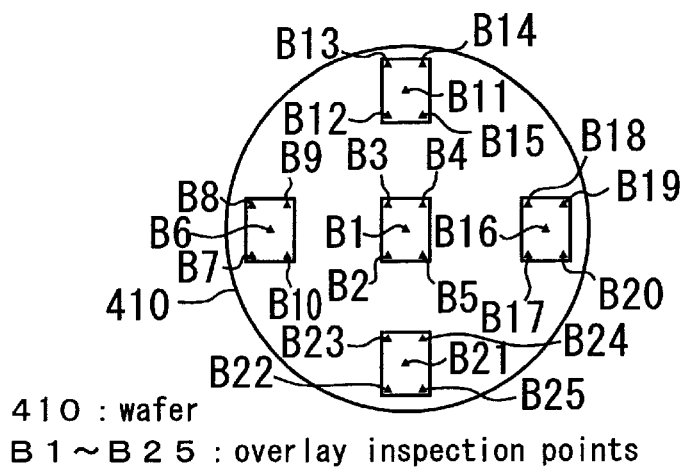
410 : wafer
B1～B25 : overlay inspection points
F I G. 4 B
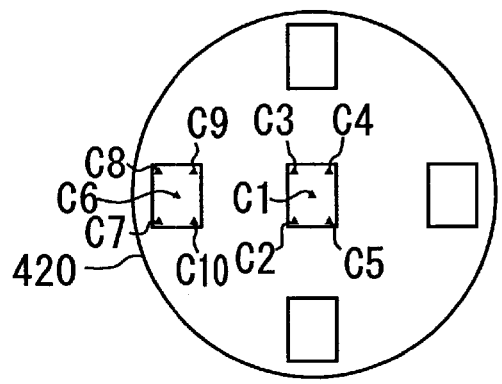
410 : wafer
C1～C10 : resist pattern inspection points
F I G. 4 C 500 : major process D
501 : photolithography pocess
503 : resist pattern inspection
505 : etched pattern inspection
507 : link determination 21 : resist pattern inspection dimension
22 : etched pattern dimension
505 : etched pattern inspection
503 : resist pattern inspection process

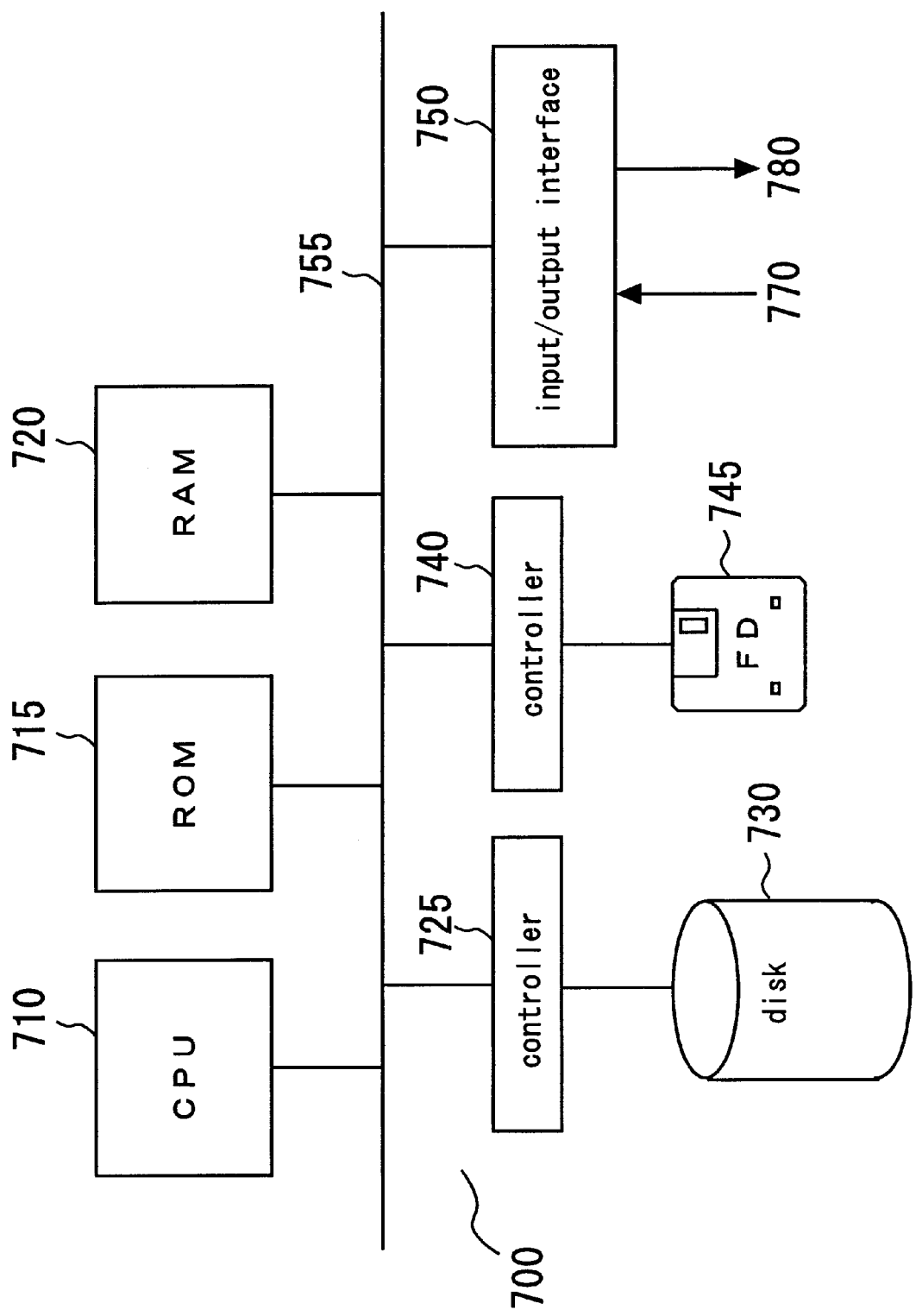
F I G. 7

100 : major process A    103 : overlay inspection
110 : major process B    105 : resist pattern inspection
120 : major process C    109 : etched pattern inspection
101 : photolithography step 1 : etched pattern inspection target dimension
2 : resist pattern inspection target dimension
3 : overlay offset in the overlay major process B
4 : design manual value
5 : a pattern formed in an overlay major process B
6 : a pattern formed through a lower layer majority process A 1 : etched pattern inspection target dimension
2 : resist pattern inspection target dimension
4 : design manual value
7 : etched pattern inspection dimension
8 : resist pattern inspection dimension
9 : overlay offset

LOT DETERMINATION APPARATUS, LOT DETERMINATION METHOD, AND RECORDING MEDIUM FOR STORING THE METHOD

BACKGROUND OF THE INVENTION

1. Field of the Invention

The present invention relates to a lot determination apparatus and method and to a recording medium for storing the lot determination method, and more particularly to a lot determination apparatus and method for determining whether or not a chip is defective by use of a pattern dimension in each process and an overlay offset, as well as to a recording medium for storing the lot determination method.

2. Description of Related Art

In a semiconductor device manufacturing process in which patterning is effected by several repetitions of photolithography, a positional relationship between an upper layer and a lower layer is very critical. If a wafer is subjected to patterning while the upper layer is greatly offset from the lower layer or while a pattern is changed greatly in size, the lot to which the wafer belongs (i.e., chips) thus patterned will not properly operate as devices. Thus, a pattern dimension inspection (hereinafter referred to as a "dimension inspection") is indispensable for producing a conforming lot. The dimension inspection can be divided into a resist dimension inspection (hereinafter referred to as a "resist pattern inspection") to be performed immediately after photolithography and a post-etching pattern dimension inspection (hereinafter referred to as an "etched pattern inspection"). On the basis of the interrelationships among inspection results, a determination must be made as to whether or not a wafer or chips is(are) defective, in consideration of the result of a pattern overlay inspection (hereinafter referred to as an "overlay inspection") for checking an offset between an already-existing pattern (a first pattern) and a newly formed pattern, as well as in consideration of the foregoing inspections.

FIG. 8 shows a conventional photolithography step and a flow of inspection and determination steps following the photolithography. As illustrated in FIG. 8, a semiconductor manufacturing process comprises a major process A100, a major process B110, and a major process C120. In each of the major processes; for example, in the major process A100, there are performed a photolithography step 101 for newly forming a pattern on an already-existing pattern (i.e., a first pattern) through exposure and development, an overlay inspection 103 for checking an offset between the newly formed pattern and the already-existing pattern (the first pattern), a resist pattern inspection 105 for checking the dimension of a resist pattern before exfoliation, and an etched pattern inspection 109 for checking the dimension of a pattern which is formed by etching of the wafer while the resist pattern is used as a mask and by removal of the resist pattern. If a nonconforming chip is found during the overlay inspection 103 or the resist pattern inspection 105 in the course of the three steps of inspections, i.e., the overlay inspection 103, the resist pattern inspection 105, and the etched pattern inspection 109, the wafer is again subjected to the photolithography step 101. In order for conforming chips to be produced, the inspection steps mentioned above must be repeated until inspection results fall within the specifications.

FIG. 9 shows one example of an ideal photolithography pattern. In FIG. 9, reference numeral 6 designates a pattern (e.g., a wiring pattern) formed through a lower layer majority process A; 5 designates a pattern (e.g., holes) formed in an overlay major process B following the lower layer major process; 1 designates an etched pattern inspection target dimension (S1) which represents an ideal dimension to serve as the target in the lower layer major process A; 2 designates a resist pattern inspection target dimension (S3) which is an ideal dimension to serve as the target in the overlay major process B; 3 designates an overlay offset in the overlay major process B (S2, where S2=0, because a photolithography pattern is ideal); and 4 designates a design manual (DM) value, i.e., an allowable distance between a pattern to be imaged in the lower layer major process A and a pattern to be imaged in the overlay major process B, when patterns are imaged on the wafer in conformity with the target dimensions.

FIG. 10 shows one example of an actual photolithography pattern. In FIG. 10, reference numerals which are the same as those shown in FIG. 9 designate identical elements, and hence repetition of their explanations will be omitted. In FIG. 10, reference numeral 7 designates the dimension (etched pattern inspection dimension R1) of an actually-manufactured first pattern measured in the post-etching inspection of the lower layer majority process A; 8 designates the dimension (resist pattern inspection dimension R3) of an actually-manufactured second pattern measured in the overlay majority process B; and 9 designates an overlay offset (R2) between the resist pattern inspection target dimension 2 and the dimension of the second pattern measured in the overlay major process B. As shown in FIG. 10, in effect, the photolithography pattern is imaged on the wafer while being offset from a target area for reasons of imprecision of a device or process employed for patterning. Therefore, to prevent production of a nonconforming wafer or chip, specifications must be determined for individual processes in expectation of worst dimensional offsets or overlay offsets for individual inspection steps. However, since the specifications are determined for individual processes in expectation of worst dimensional offsets or overlay offsets for individual inspection steps, a lot (or chips) which should essentially be deemed a conforming lot (or conforming chips) is (are) sometimes regarded to be nonconforming. As a result, the wafer is again subjected to photolithography, thereby resulting in an increase in a reprocessing ratio.

When specifications for individual processes are determined in expectation of worst dimensional offsets or overlay offsets in the manner as mentioned above, some devices cannot satisfy the required precision, with the result that carrying out a photolithography process thereon becomes impossible. For this reason, manufacturing processes are sometimes carried out under relaxation of the specifications for inspection steps. In such a case, a nonconforming lot or nonconforming chips may be overlooked, and in a subsequent step the nonconforming chips may be removed from the lot as being defective.

SUMMARY OF THE INVENTION

The object of the present invention is to solve the previously-described problem and to provide a lot determination apparatus and method which enable a reduction in the number of wafers to be re-subjected to photolithography and to prevent elimination of chips from a lot in a subsequent step, by determination of whether or not each chip is conforming, in comprehensive determination of results of a plurality of inspections such as an overlay inspection, an etched pattern inspection, and a resist pattern inspection.

According to a first aspect of the present invention, there is provided a lot determination apparatus which through inspection determines whether or not the lot of semiconductor wafers is conforming, the apparatus comprising: computational means for computing the sum of a value corresponding to a difference between the dimension of a first pattern formed on the lot and a dimension of a target pattern (or target dimension) of the first pattern, a value corresponding to a difference between a second pattern formed so as to be laid over the lot and a dimension of a target pattern (or target dimension) of the second pattern, a value corresponding to an offset between the first pattern and the second pattern when they are superimposed one on the other, and a predetermined adjustment value; and means for determining whether or not the lot is conforming, by comparison between the value obtained by the computational means and predetermined allowable value for the lot.

According to a second aspect of the present invention, there is provided a lot determination method including a plurality of major processes for determining, through inspection, whether or not the lot of semiconductor wafer is conforming, the method comprising: a first inspection step of inspecting the dimension of a first pattern formed on the lot; a second inspection step of inspecting an overlay between a second pattern formed on the lot and the first pattern in a second major process subsequent to the first major process; a third inspection step of inspecting the dimension of the second pattern formed on the lot in the second major process; and a link determination step, wherein the link determination step includes a computational step of computing, every inspection points inspected by the first inspection step, the second inspection step and the third inspection step, the sum of a value corresponding to a difference between the dimension of the first pattern and a dimension of a target pattern (or target dimension) of the first pattern, a value corresponding to an offset of the overlay obtained by the second inspection step, a value corresponding to a difference between the second pattern and a dimension of a target pattern (or target dimension) of the second pattern, and a predetermined adjustment value; and a step of determining whether or not the lot is conforming, by comparison between the value obtained in the computational step and a predetermined allowable value for the lot.

According to a third aspect of the present invention, there is provided a lot determination method for determining, through inspection, whether or not the lot of semiconductor wafers is conforming, the method comprising: a first inspection step of inspecting the dimension of a first pattern formed on the lot; a second inspection step of inspecting the dimension of a second pattern formed on the lot; and a link determination step, wherein the link determination step includes a computational process for calculating a difference between a value corresponding to a value obtained in the first inspection step and a value corresponding to a value obtained in the second inspection step; and a step of determining whether or not the lot is conforming, by comparison between the value obtained in the first inspection step and a predetermined specification value regarding the lot.

According to a fourth aspect of the present invention, there is provided a computer-readable recording medium on which may be recorded a program for executing the lot determination method including a plurality of major processes for determining, through inspection, whether or not the lot of semiconductor wafer is conforming, the method comprising: a first inspection step of inspecting the dimension of a first pattern formed on the lot; a second inspection step of inspecting an overlay between a second pattern formed on the lot and the first pattern in a second major process subsequent to the first major process; a third inspection step of inspecting the dimension of the second pattern formed on the lot in the second major process; and a link determination step, wherein the link determination step includes a computational step of computing, every inspection points inspected by the first inspection step, the second inspection step and the third inspection step, the sum of a value corresponding to a difference between the dimension of the first pattern and a dimension of a target pattern of the first pattern, a value corresponding to an offset of the overlay obtained by the second inspection step, a value corresponding to a difference between the second pattern and a dimension of a target pattern of the second pattern, and a predetermined adjustment value; and a step of determining whether or not the lot is conforming, by comparison between the value obtained in the computational step and a predetermined allowable value for the lot.

According to a fifth aspect of the present invention, there is provided a computer-readable recording medium on which may be recorded a program for executing the lot determination method for determining, through inspection, whether or not the lot of semiconductor wafers is conforming, the method comprising: a first inspection step of inspecting the dimension of a first pattern formed on the lot; a second inspection step of inspecting the dimension of a second pattern formed on the lot; and a link determination step, wherein the link determination step includes a computational process for calculating a difference between a value corresponding to a value obtained in the first inspection step and a value corresponding to a value obtained in the second inspection step; and a step of determining whether or not the lot is conforming, by comparison between the value obtained in the first inspection step and a predetermined specification value regarding the lot.

The above and other objects, effects, features and advantages of the present invention will become more apparent from the following description of the embodiments thereof taken in conjunction with the accompanying drawings.

BRIEF DESCRIPTION OF THE DRAWINGS

FIG. 1 is a photolithography inspection and determination flow including a lot determination method according to the present invention.

FIG. 3A is one example of a photolithography pattern actually used in the embodiment 1, and FIG. 3B is a cross-sectional view taken along line A1–A2 shown in FIG. 3A.

FIGS. 4A to 4C show one example of measurement points in the respective major processes according to the embodiment 2.

FIG. 7 is a schematic block diagram of a lot determination apparatus according to the present invention.

DETAILED DESCRIPTION OF THE PREFERRED EMBODIMENTS

Figure 2:
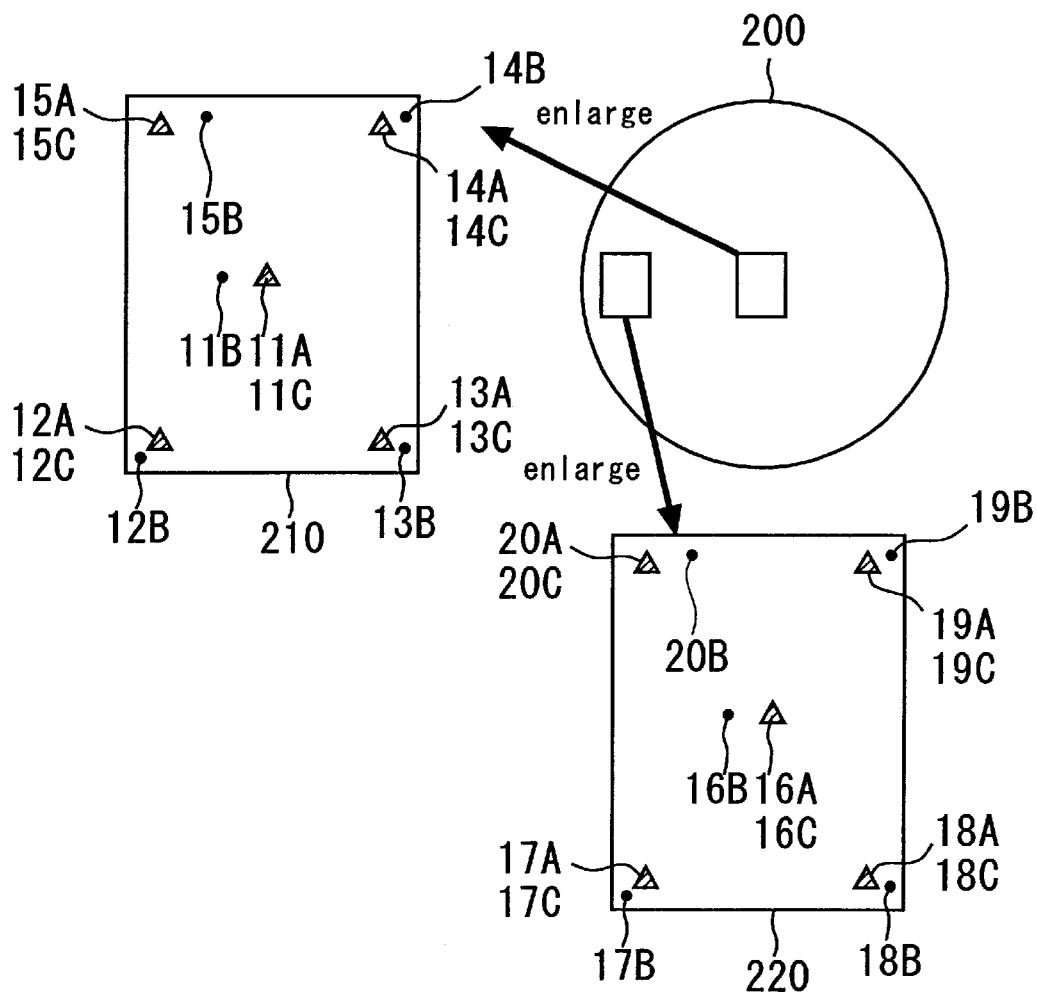
FIG. 2 shows measurement points used for carrying out the overlay inspection 103, the resist pattern inspection 105, and the etched pattern inspection 109 according to the embodiment 1.

Embodiments of the present invention will be described below with reference to the accompanying drawings. It is noted that the same reference symbols in the drawings denote the same or corresponding components.

Embodiment 1

Figure 8:
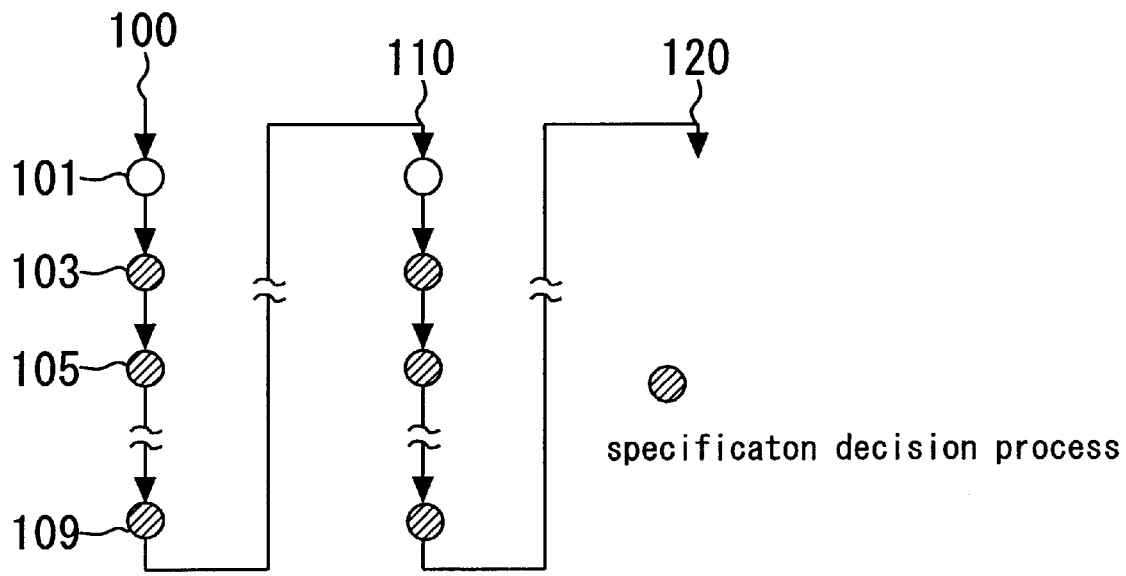
FIG. 8 shows a conventional photolithography step and a flow of inspection and determination steps following the photolithography.
Figure 9:
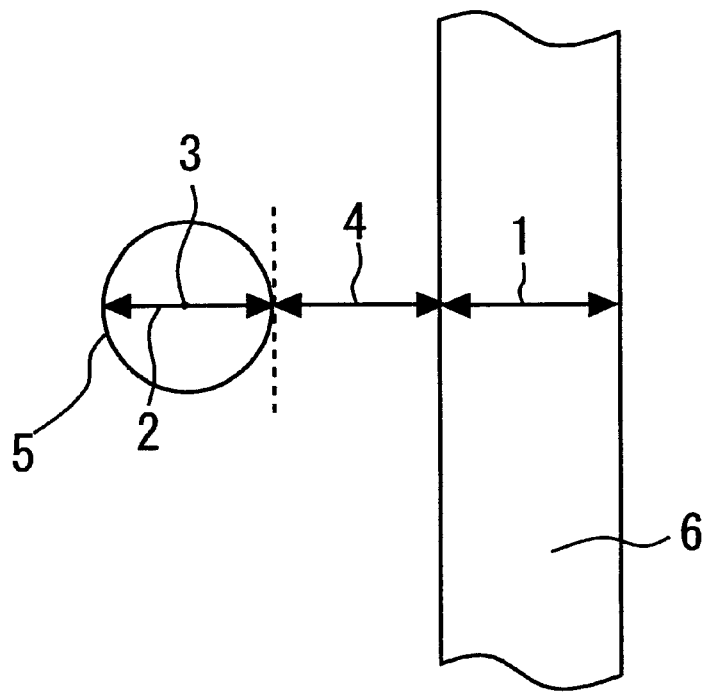
FIG. 9 shows one example of an ideal photolithography pattern.
Figure 10:
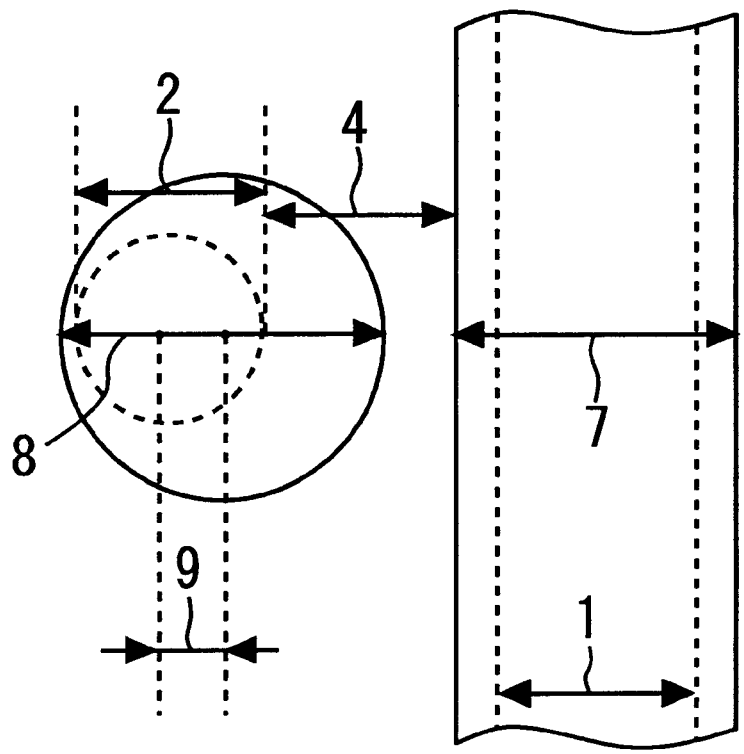
FIG. 10 shows one example of an actual photolithography pattern.

FIG. 1 is a photolithography inspection and determination flow including a lot determination method according to the present invention. As shown in FIG. 1, a semiconductor manufacturing process comprises a major process A100, a major process B110, and a major process C120. For example, a first pattern is formed in the major process A100, and the dimension of the thus-formed first pattern is checked (an etched pattern inspection 109). In the major process B110 subsequent to the etched pattern inspection 109, there is performed a photolithography step 101, in which a second pattern is overlaid on the first pattern. An overlay inspection 103 is performed for checking whether or not the thus-formed second pattern is laid on the first pattern. A difference between the conventional photolithography inspection and determination flow shown in FIG. 8 and the photolithography inspection and determination flow according to the present invention lies in that a link determination 107, which is a lot determination method according to the present invention, is carried out after a resist pattern inspection 105 which permits reprocessing of a defective wafer. As will be described later, addition of the link determination 107 to the inspection steps enables reprocessing of a lot (or chips) which has been determined to be defective, without involvement of an increase in a reprocessing ratio. Further, there can be prevented elimination of chips from a lot in a subsequent step, which would otherwise be caused by excessive relaxation of inspection specifications. After the link determination 107, the wafer is subjected to the etched pattern inspection 109 in the major process B.

As in the case of the major process B110, the etched pattern inspection 109 of the major process A100 follows preprocessing steps, i.e., a photolithography step, an overlay inspection step, a resist pattern inspection step, and a link determination step. The same also applies to the major process C120.

FIG. 2 shows measurement points used for carrying out the overlay inspection 103, the resist pattern inspection 105, and the etched pattern inspection 109 according to the embodiment 1. FIG. 2 illustrates enlarged views of shots 210 and 220 on a wafer 200. In FIG. 2, reference numerals 11A to 15A are resist pattern inspection measurement points for the shot 210; 11B to 15B are overlay inspection measurement points for the shot 210; 11C to 15C are dimension inspection measurement points for the shot 210; 16A to 20A are resist pattern inspection measurement points for the shot 220; 16B to 20B are overlay inspection measurement points for the shot 220; and 16C to 20C are dimension inspection measurement points for the shot 220. As shown in FIG. 2, the overlay inspection 103, the resist pattern inspection 105, and the etched pattern inspection 109 may employ different measurement points. Alternatively, the inspections may employ the same measurement points.

FIG. 3A is one example of a photolithography pattern actually used in the embodiment 1, and FIG. 3B is a cross-sectional view taken along line A1–A2 shown in FIG. 3A. In FIGS. 3A and 3B, reference numeral 1 designates an etched pattern inspection target dimension (S1) which represents an ideal dimension of a first pattern to serve as a target in the lower layer major process A; 2 designates a resist pattern inspection target dimension (S3) which is an ideal dimension of a second pattern to serve as a target in the overlay major process B; 4 designates a design manual (DM) value; 7 designates an etched pattern inspection dimension (R1) of the first pattern actually formed in the lower layer major process A; 8 designates a resist pattern inspection (R3) of the second pattern actually formed in the overlay major process B; 9 designates an offset (R2) between the first pattern formed in the lower layer major process A and the second pattern formed in the overlay major process B; and 10 designates an adjustment value L which represents a correlation thickness which must be ensured between the first pattern formed in the lower layer major process A and the second pattern formed in the overlay major process B. The adjustment value L may be determined from empirical data or through simulation. S2 (not shown) represents an overlay offset target value in the overlay major process B and is set to S2=0.

In each of the measurement points shown in FIG. 2, the link determination 107 makes a determination according to the following determination equation (1).

$$(R1-S1)/2+(R3-S3)/2+(R2-S2)+L < DM \text{ value} \quad (1)$$

When the left side of determination equation (1) $\geq$ a DM value (i.e., when a lot is determined to be nonconforming), a short circuit is determined to have occurred between the first and second patterns. In this case, the semiconductor device is designated to be nonconforming, and a lot (or chips) which does (do) not conform to the specifications of the link determination according to equation (1) is subjected to reprocessing. As can be seen from determination equation (1), the lot is determined from a plurality of inspection results, thereby enabling relaxation of individual inspection specifications and hence a reduction in a reprocessing ratio. Further, while the left side of determination equation (1) <DM value, no electrical short circuit arises between the first and second patterns. Therefore, elimination of the lot in a subsequent step can be prevented. One example of the determination equation in the measurement point is expressed as the following determination equation (2), with reference to measurement points 11A (a resist pattern inspection), 11B (an overlap inspection), and 11C (an etched pattern inspection) [hereinafter referred to as a "set of measurement points 11"].

$$(<11A>-S1)/2+(<11C>-S3)/2+(<11B>-S2)+L < DM \text{ value} \quad (2)$$

In determination equation (2), <11A>, <11B>, and <11C> represent values measured for the individual measurement points 11A, 11B, and 11C of the set of measurement points 11. As in the case of determination equation (2), determination equations may be defined for another set of measurement points 12 comprising measurement points 12A, 12B, and 12C, as well as for still another set of measurement points 15 comprising measurement points 15A, 15B, and 15C. In the case of the shot 210, five determination equations may be defined for the five measurement point sets. Similarly, five determination equations may be defined for the shot 220. Of the five determination equations thus defined for each shot, if the determination equation for one set of measurement points shows that the lot is nonconforming, the lot is subjected to reprocessing.

Although in the embodiment 1 five sets of measurement points are defined for each of two shots, the embodiment is only illustrative; the number of shots to be subjected to the link determination 107 and the number of sets of measurement points to be measured in each shot can be increased or decreased, as needed. Further, the overlay inspection 103, the resist pattern inspection 105, and the etched pattern inspection 109 may employ measurement points which differ in position from one another, or all the inspections may use the same measurement points may. The number of processes to be subjected to link determination is not limited to three, i.e., the overlay inspection step 103, the resist pattern inspection step 105, and the etched pattern inspection step 109. The number of processes may be increased so as to include other process or may be decreased.

Although in the embodiment 1 the resist pattern inspection 105 is carried out after the overlay inspection 103, the resist pattern inspection 105 may be carried out before the overlay inspection 103.

As mentioned above, according to the embodiment 1, a decision is made as to whether or not the lot is conforming, from results of a plurality of inspection processes, thereby making it possible to prevent rejection of the lot to be prevented as being nonconforming. As a result, inspection specifications may be relaxed, which in turn enables a reduction in the reprocessing ratio. Further, since an electrical short circuit cannot arise between patterns while the determination equations are satisfied, elimination of the lot in a subsequent process can be prevented.

Embodiment 2

Although in the embodiment 1 a link determination is made for each set of measurement points, in the embodiment 2 a link determination is made on the basis of analysis of results of all the measurement points.

FIGS. 4A to 4C show one example of measurement points in the respective major processes according to the embodiment 2. FIG. 4A shows etched pattern inspection points A1 to A13 of the major process A on a wafer 400; FIG. 4B shows overlay inspection points B1 to B25 of the major process B on the wafer 400; and FIG. 4C shows resist pattern inspection points C1 to C10 on the wafer 400. Determination equation (3) shown below is determined from these measurement points, and a link determination is made on the basis of analysis of measurement results.

$$(max1-S1)/2+(max3-S3)/2+((max(ABS(max2), ABS(min2))-S2)+L<DM\ value \quad (3)$$

In determination equation (3), S1 through S3 and the DM value assume values which are identical with those in the embodiment 1. Here, max(X,Y) represents the maximum values for X and Y; ABS(Z) represents an absolute value of Z; max1 represents the maximum value among <A1> through <A13>; min1 represents the minimum value among <A1> through <A13>; max2 represents the maximum value among <B1> through <B25>; min2 represents the minimum value among <B1> through <B25>; max3 represents the maximum value among <C1> through <C10>; and min3 represents the minimum value among <C1> through <C10>. When determination equation (3) shows that the lot is nonconforming, the lot is subjected to reprocessing. As mentioned above, since the link determination is made on the basis of analysis of the results of all the measurement points, a more accurate link determination can be made.

Although in determination equation (3) max1, max3, and max{ABS(max2), ABS(min2)} are used for the purpose of illustration, mini1, min3 or min{ABS(max2), ABS(min2)} may be used in place of or in combination with them, as required. For example, min1 may be used in lieu of max1, and min3 may be used in lieu of max3.

Although in the description of the embodiment 2 there are used thirteen etched pattern inspection points, twenty-five overlay inspection points, and ten resist pattern inspection points, they are provided only for the purpose of illustration; the number of points may be increased or decreased, as required. The overlay inspection 103, the resist pattern inspection 105, and the etched pattern inspection 109 may employ different measurement points, or all the inspections may employ the same measurement points. The link determination is not limited solely to three processes, i.e., the overlay inspection process 103, the resist pattern inspection process 105, and the etched pattern inspection process 109; the number of processes may be increased so as to include other process or may be decreased.

As mentioned above, in the embodiment 2 a link determination is made on the basis of all the measurement points, and hence a more accurate link determination may be attained. As a result, specifications for inspection may be relaxed, which in turn enables a further reduction in reprocessing ratio. Moreover, since no short circuit arises between the first and second patterns while determination equations are satisfied, elimination of a lot in a subsequent process can be prevented.

Embodiment 3

Figure 5:
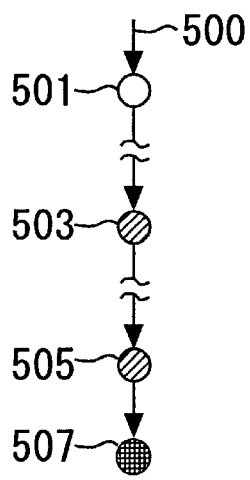
FIG. 5 is a photolithography inspection and determination flow including a lot determination method according to a embodiment 3.

FIG. 5 is a photolithography inspection and determination flow including a lot determination method according to a embodiment 3. As shown in FIG. 5, in a major process D500, there are carried out a photolithography process 501 for forming a second pattern so as to be superimposed on a first pattern; a resist pattern inspection 503 for inspecting the dimension of the second pattern; an etched pattern inspection 505 for inspecting the dimension of the first pattern; and a link determination 507 which is carried out after the etched pattern inspection 505.

Figure 6:
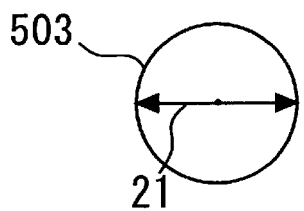
FIG. 6 shows the pattern measured in the resist pattern inspection process 503 and the etched pattern inspection process 505.
Figure 6:
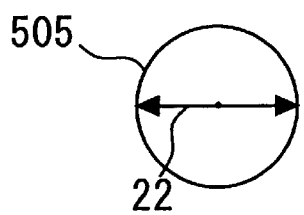

FIG. 6 shows the pattern measured in the resist pattern inspection process 503 and the etched pattern inspection process 505. Reference numeral 21 designates a resist pattern inspection dimension measured in the resist pattern inspection process 503, and 22 designates an etched pattern dimension measured in the etched pattern inspection process 505. A CD loss value (CD loss=the resist pattern inspection dimension 21—the etched pattern dimension 22) may be calculated from data related to the resist pattern inspection dimension 21 and the etched pattern dimension 22. A predetermined specification value is provided for the CD loss value. For each lot, the CD loss value is compared with the predetermined specification value, and an alarm can be activated when the lot is determined to be nonconforming. If the CD loss value must be set equal to or smaller than a predetermined specification value P, the link determination 507 is carried out according to determination equation (4) provided below.

$$Resist\ pattern\ inspection\ dimension\ 21 - etched\ pattern\ dimension\ 22 < P \quad (4)$$

The determination equation may be generalized as equation (5) provided below.

$$k1(resist\ pattern\ inspection\ dimension\ 21)/n1 - k2(etched\ pattern\ dimension\ 22)/n2 + L < DM\ value \quad (5)$$

In determination equation (5), k1 and k2 designate arbitrary functions; n1 and n2 designate arbitrary constants; and L and DM values are identical with those in the embodiment 1. Data related to the resist pattern inspection dimension 21 and the etched pattern dimension 22 can be subjected to link determination for each set of measurement points, as in the case of the embodiment 1. Alternatively, as in the case of the embodiment 2, a link determination may be made on the basis of analysis of measurement results of all the measurement points. As mentioned above, in the embodiment 3, the link determination 507 may be made with regard to items which cannot be found through checking in the preceding inspection processes, through use of predetermined specification values.

As mentioned above, according to the embodiment 3, a CD loss value is calculated from data related to the resist pattern inspection dimension and the etched pattern dimension. When a lot is found to be nonconforming as a result of comparison of a CD loss value of the lot with a predetermined specification value, an alarm is activated. Therefore, with regard to items which cannot be found through checking in the preceding inspection processes, a link determination can be carried out through use of predetermined specification values. A lot for which the determination equations are satisfied may be deemed to be conforming, thereby preventing elimination of a lot in a subsequent process.

Embodiment 4

The link determination described in the previous first through embodiment 3s may be generalized and expressed as equation (6) provided below.

$$k1(F1(x1)-S1)/n1+k2(F2(x2)-S2)/n2+k3(F3(x3)-S3)/n3+ \ldots +km(Fm(xm)-Sm)/nm+L < DM \text{ value} \quad (6)$$

In equation (6), k1, k2, k3, ..., km represent constants; n1, n2, n3, ..., nm represent constants; F1, F2, F3, ..., Fm represent predetermined functions used for respective measured values x1, x2, ..., xm; and S1 through S3, L, and a DM value are identical with those used in the embodiment 1. Examples of a predetermined function such as F1 include the foregoing maximum value (max), the minimum value (min), an absolute value abs(max) of the maximum value, an absolute value abs(min) of the minimum value, a mean value of values measured at measurement points, a standard deviation $\alpha$, ave+$\alpha$, ave+2$\alpha$, ave+2.5$\alpha$, ave+3$\alpha$, and the like. More versatile link determination may be carried out by setting predetermined parameters k1, n1, and F1 in the foregoing generalized link determination equations. If link determination is simultaneously carried out in the final data collection process according to determination equation (6), link determination can be made without involvement of provision of a new process, thereby improving throughput. The lot that has been determined to be nonconforming as a result of link determination is locked and can be reprocessed at its present location. As a result, the reprocessing ratio can be reduced to a much greater extent. Further, a nonconforming lot is detected early, thereby preventing elimination of the lot in a subsequent step.

As mentioned above, according to the embodiment 4, more versatile link determination may be carried out by using the generalized link determination equations. If link determination is simultaneously carried out in the final data collection process, link determination can be made without involvement of provision of a new process. The lot that has been determined to be nonconforming as a result of link determination is locked and can be reprocessed at its present location. As a result, the reprocessing ratio can be reduced to a much greater extent because the inspection specification may be relaxed. Moreover, since no short circuit arises between patterns while determination equations are satisfied, elimination of a lot in a subsequent process can be prevented.

Embodiment 5

FIG. 7 is a schematic block diagram of a lot determination apparatus according to the present invention. In FIG. 7, the lot determination method described with reference to the foregoing first through embodiment 4s can be recorded as a computer program in ROM (Read Only Memory) 715, a disk 730, or a floppy disk 745. The lot determination computer program is loaded to RAM (Random Access Memory) 720 over a bus 755, from the disk 730 by way of a controller 725 or from the floppy disk 745 by way of a controller 740. A CPU (Central Processing Unit) 710 executes the lot determination computer program stored in the RAM 720 and enables receipt of measured data from an external data collection device 770 (not shown), as well as outputting of a result of lot determination to an external output device 780 (not shown). As mentioned previously, the lot determination method is installed in the lot determination apparatus in the form of a computer program, whereby link determination may be carried out automatically to thereby improve throughput by entry of only parameters; for example, k1, n1, and F1 of determination equation (7) in the embodiment 4.

As mentioned above, according to the embodiment 5, the lot determination method is installed in the lot determination apparatus as a computer program. As a result, link determination can be carried out automatically by instruction of only individual parameters, thereby improving link determination throughput.

Embodiment 6

The object of the present invention can be accomplished by insertion, into the lot determination apparatus 700, of a recording medium on which is recorded a computer program for effecting the features described in the first through embodiment 4s, e.g., the floppy disk 745, as well as by reading of the computer program stored in the recording medium by the CPU 710 of the lot determination apparatus 700. In this case, the computer program per se read from the recording medium effects the novel feature of the present invention, and the recording medium having the computer program recorded thereon constitutes the present invention. Not only the floppy disk 745, but also another disk 730 or the ROM 715 may also be used as a recording medium on which a computer program is recorded. Further, a CD-ROM, an optical disk, or a memory card may also be used as a recording medium.

As mentioned above, in the embodiment 6, a recording medium on which is recorded a computer program that effects the features described in the firth through embodiment 4s is inserted into the lot determination apparatus 700, thereby enabling the CPU 710 of the lot determination apparatus 700 to read the computer program recorded on the recording medium. Thus, the object of the present invention can be accomplished.

In the lot determination method, the computational step may comprise computation of the sum of a value corresponding to a difference between either the maximum or minimum dimension of the first pattern obtained in the first inspection step and the dimension of the target pattern of the first pattern, a value corresponding to a difference between the maximum or minimum dimension of the second pattern obtained in the third inspection step and the dimension of the target pattern of the second pattern, a value corresponding to either of the maximum value or the minimum value between an absolute value of the maximum value corresponding to the offset of the overlay obtained by the second inspection step and an absolute value of the minimum value corresponding to the offset of the overlay obtained by the second inspection step, and a predetermined adjustment value, with regard to all the inspection points inspected in the first, second, and third inspection steps.

In the lot determination method, the computational step may comprise addition of, at least, a value corresponding to a difference between a value that is obtained from the dimension of the first pattern through use of a predetermined function and the dimension of the target pattern of the first pattern, a value that is obtained from the offset of the overlay obtained by the second inspection step through use of a predetermined function and the dimension of the target pattern of the first pattern, a value corresponding to a difference between a value that is obtained from the dimension of the second pattern through use of a predetermined function and the dimension of the target pattern of the second pattern, and a predetermined adjustment value.

As mentioned previously, the present invention can provide a lot determination apparatus and method and a recording medium having the lot determination method recorded thereon, wherein there can be realized a reduction in the number of times wafers are re-subjected to photolithography and prevention of elimination of a chip lot in a subsequent step, through determination of whether or not a chip is conforming by comprehensive determination of results of a plurality of inspections such as an overlay inspection, an etched pattern inspection, and a resist pattern inspection.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-372983 filed on Dec. 28, 1998 including specification, claims, drawings and summary are incorporated herein by reference in its entirety.

What is claimed is:

1. A lot determination apparatus which through inspection determines whether or not the lot of semiconductor wafers is conforming, the apparatus comprising:

computational means for computing a sum of a value corresponding to a difference between a dimension of a first pattern formed on said lot and a dimension of a target pattern of the first pattern, a value corresponding to a difference between a dimension of a second pattern formed so as to be laid over said lot and a dimension of a target pattern of the second pattern, a value corresponding to an offset between the first pattern and the second pattern when they are superimposed one on the other, and a predetermined adjustment value; and means for determining whether or not said lot is conforming, by comparison between the sum obtained by said computational means and predetermined allowable value for said lot.

2. A lot determination method including a plurality of major processes for determining, through inspection, whether or not the lot of semiconductor wafer is conforming, the method comprising:

a first inspection step of inspecting the dimension of a first pattern formed on said lot in a first major process;

a second inspection step of inspecting an overlay between a second pattern formed on said lot and the first pattern in a second major process subsequent to said first major process;

a third inspection step of inspecting the dimension of the second pattern formed on said lot in said second major process; and a link determination step, wherein said link determination step includes a computational step of computing, every inspection points inspected by said first inspection step, said second inspection step and said third inspection step, a sum of a value corresponding to a difference between the dimension of the first pattern and a dimension of a target pattern of the first pattern, a value corresponding to an offset of the overlay obtained by said second inspection step, a value corresponding to a difference between the second pattern and a dimension of a target pattern of the second pattern, and a predetermined adjustment value; and a step of determining whether or not said lot is conforming, by comparison between the sum obtained in said computational step and a predetermined allowable value for said lot.

3. The lot determination method according to claim 2, wherein said computational step comprises computation of a sum of a value corresponding to a difference between either the maximum or minimum dimension of the first pattern obtained in said first inspection step and the dimension of the target pattern of the first pattern, a value corresponding to a difference between the maximum or minimum dimension of the second pattern obtained in said third inspection step and the dimension of the target pattern of the second pattern, a value corresponding to either of the maximum value or the minimum value between an absolute value of the maximum value corresponding to the offset of the overlay obtained by said second inspection step and an absolute value of the minimum value corresponding to the offset of the overlay obtained by said second inspection step, and a predetermined adjustment value, with regard to all the inspection points inspected in the first, second, and third inspection steps.

4. The lot determination method according to claim 3, wherein said computational step comprises adding to the sum, at least, a value corresponding to a difference between a value that is obtained from the dimension of the first pattern through use of a predetermined function and the dimension of the target pattern of the first pattern, a value that is obtained from the offset of the overlay obtained by said second inspection step through use of a predetermined function and the dimension of the target pattern of the first pattern, a value corresponding to a difference between a value that is obtained from the dimension of the second pattern through use of a predetermined function and the dimension of the target pattern of the second pattern, and a predetermined adjustment value.

5. The lot determination method according to claim 2, wherein said computational step comprises adding to the sum, at least, a value corresponding to a difference between a value that is obtained from the dimension of the first pattern through use of a predetermined function and the dimension of the target pattern of the first pattern, a value that is obtained from the offset of the overlay obtained by said second inspection step through use of a predetermined function and the dimension of the target pattern of the first pattern, a value corresponding to a difference between a value that is obtained from the dimension of the second pattern through use of a predetermined function and the dimension of the target pattern of the second pattern, and a predetermined adjustment value.

6. A lot determination method for determining, through inspection, whether or not the lot of semiconductor wafers is conforming, the method comprising:

- a first inspection step of inspecting the dimension of a first pattern formed on said lot;
- a second inspection step of inspecting the dimension of a second pattern formed on said lot; and
- a link determination step, wherein said link determination step includes
- a computational process for calculating a sum of a value corresponding to a difference between the dimension of the first pattern obtained in said first inspection step and a dimension of a target pattern of the first pattern and a value corresponding to a difference between the dimension of the second pattern obtained in said second inspection step and a dimension of a target pattern of the second pattern; and
- a step of determining whether or not said lot is conforming, by comparison between the sum value obtained in the computational process and a predetermined specification value regarding said lot.

* * * * *